US006809267B1

United States Patent
Kurita et al.

(10) Patent No.: US 6,809,267 B1
(45) Date of Patent: Oct. 26, 2004

(54) FLEXIBLE PRINTED WIRING BOARD AND ITS PRODUCTION METHOD

(75) Inventors: Hideyuki Kurita, Kanuma (JP); Masato Taniguchi, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/936,359

(22) PCT Filed: Jan. 25, 2000

(86) PCT No.: PCT/JP00/00344

§ 371 (c)(1), (2), (4) Date: Jan. 2, 2002

(87) PCT Pub. No.: WO01/56339

PCT Pub. Date: Aug. 2, 2001

(51) Int. Cl.[7] .................................. H05K 1/00
(52) U.S. Cl. ........................ 174/254; 174/266
(58) Field of Search ................. 361/749, 803, 361/792–795; 174/254–260, 263–266; 29/830, 842–846; 428/192; 228/180.21

(56) References Cited

U.S. PATENT DOCUMENTS

| 4,950,527 A | * | 8/1990 | Yamada .................. 174/250 |
| 5,079,065 A | * | 1/1992 | Masakazu et al. ........ 428/137 |
| 5,118,386 A | * | 6/1992 | Kataoka et al. .......... 174/254 |
| 5,203,075 A | * | 4/1993 | Angulas et al. ........... 29/830 |
| 5,342,207 A | * | 8/1994 | Sobhani .................... 439/74 |
| 5,873,161 A | * | 2/1999 | Chen et al. ................ 29/830 |
| 5,949,141 A | * | 9/1999 | Farnworth et al. ....... 257/737 |
| 6,395,993 B1 | * | 5/2002 | Nakamura et al. ...... 174/254 |

FOREIGN PATENT DOCUMENTS

| JP | 6-112620 A | 4/1994 |
| JP | 6-132618 A | 5/1994 |
| JP | 6-287326 A | 10/1994 |
| JP | 7-90243 A | 4/1995 |
| JP | 7-202373 A | 8/1995 |
| JP | 7-297541 A | 11/1995 |
| JP | 10-189088 A | 7/1998 |

* cited by examiner

*Primary Examiner*—Laun Thai
*Assistant Examiner*—Tuan Dinh
(74) *Attorney, Agent, or Firm*—Oliff & Berridge, PLC

(57) ABSTRACT

In a flexible printed wiring board obtained by connecting metal bumps of a first flexible printed wiring part and connection pads of a second flexible printed wiring part, the first flexible printed wiring part is composed of a conductive layer and insulating layer adjacent thereto, holes A being provided in the insulating layer so as to reach the conductive layer, metal plugs being formed in these holes by an electrolytic plating method, metal bumps being produced by making the tips of these metal plugs project from the insulating layer. In this way, as many as possible flexible printed wiring boards can be obtained from a laminated sheet for flexible printed wiring of prescribed size.

10 Claims, 5 Drawing Sheets

10

FLEXIBLE PRINTED WIRING BOARD AND ITS PRODUCTION METHOD

TECHNICAL FIELD

The present invention relates to a flexible printed wiring board and a method of manufacturing it.

BACKGROUND ART

Conventionally, flexible printed wiring boards are employed in various different fields, and their shapes are various.

For example, a typical flexible printed wiring board for use in driving a liquid panel may be of the T-shaped type as shown in FIG. 6. The terminals on the BB side are formed with relatively wide wiring pitch so that they can pass signals to the IC in a bundled fashion; on the other hand, the terminals on the AA side are formed with comparatively narrow wiring pitch so that they can be connected to a miniature semiconductor module for drive purposes.

When manufacturing flexible printed wiring boards of T-shape as in FIG. 6, a plurality of T-shaped flexible printed wiring boards per unit area of a laminated sheet for flexible printed wiring purposes obtained by forming insulating layers on conductive layers are created, and this sheet is cut to produce the individual wiring boards. Specifically, as shown in FIG. 7, T-shaped flexible printed wiring boards as shown in FIG. 6 (size: a=160 mm/b=17 mm/c=30 mm/d=20 mm/e=25 mm/f=115 mm) are created by the additive or subtractive method, utilizing a photolithographic technique or the like in a flexible printed wiring laminated sheet 71 of size: length 250 mm, width 200 mm.

However, when T-shaped flexible printed wiring boards 72 were created in a laminated sheet 71 for flexible printed wiring as shown in FIG. 7, about 58% of the laminated sheet 71 for flexible printed wiring was discarded, presenting an obstacle to a reduction in manufacturing costs. This problem becomes more severe as the height (depth) of irregularities of the external shape of the flexible printed wiring board and or its complexity increase.

In view of the above problems of the prior art, an object of the present invention is to confer on a flexible printed wiring board a structure such that as many as possible flexible printed wiring boards can be obtained from a laminated sheet for flexible printed wiring of a prescribed size.

DISCLOSURE OF THE INVENTION

The present inventors perfected the present invention by discovering that: (1) when creating flexible printed wiring boards in a laminated sheet for flexible printed wiring, the amount of laminated sheet discarded could be reduced by creating the flexible printed wiring boards divided into at least two parts; (2) when producing a single flexible printed wiring board by joining at the two parts, it is preferable for connection reliability that bump connection is achieved when the front face side of one part is connected with the back side of the other part; (3) if bumps are employed that are obtained by forming holes by chemical etching utilizing a photolithographic method in the insulating layer of the laminated sheet for flexible printed wiring, then filling these holes with metal plugs by an electrolytic plating method and further growing to metal bumps, it is not necessary to make the positional alignment accuracy excessively high when forming the holes, thereby making it possible to introduce the metal bumps with low cost.

Specifically, the present invention provides a flexible printed wiring board comprising a first flexible printed wiring part having metal bumps and a second flexible printed wiring part having connection pads, the metal bumps and the connection pads being connected to each other, wherein the first flexible printed wiring part comprises a conductive layer and an insulating layer adjacent thereto; holes are provided in the insulating layer so as to reach the conductive layer; metal plugs are formed in the above-mentioned holes by an electrolytic plating method; and the tips of the metal plugs constitute the metal bumps that project from the insulating layer.

Also, the present invention provides a method of manufacturing such a flexible printed wiring board, comprising:

(a) a step of creating first flexible printed wiring parts and/or second flexible printed wiring parts in a laminated sheet for flexible printed wiring composed of a conductive layer and an insulating layer formed adjacent thereto, such that as many as possible first flexible printed wiring parts and/or second flexible printed wiring parts can be obtained per unit area of the laminated sheet;

in which the metal bumps of the first flexible printed wiring parts are created by forming holes in the insulating layer adjacent to the conductive layer, so as to reach the conductive layer, by chemical etching using a photolithographic method, then, while forming metal plugs in the holes of the insulating layer by an electrolytic plating method in which the conductive layer is used as the cathode, further continuously growing these metal plugs by an electrolytic plating method so that the tips thereof project from the surface of the insulating layer;

(b) a step of obtaining the first flexible printed wiring parts and second flexible printed wiring parts from the laminated sheet for flexible printed wiring by cutting the same; and (c) a step of sticking together the first flexible printed wiring parts and the second flexible printed wiring parts that have thus been obtained while ensuring conduction between the metal bumps of the first flexible printed wiring parts and the connection pads of the second flexible printed wiring parts.

BEST MODE FOR CARRYING OUT THE INVENTION

Hereinbelow, an example of a flexible printed wiring board according to the present invention is described in detail with reference to the drawings.

Figure 1A:
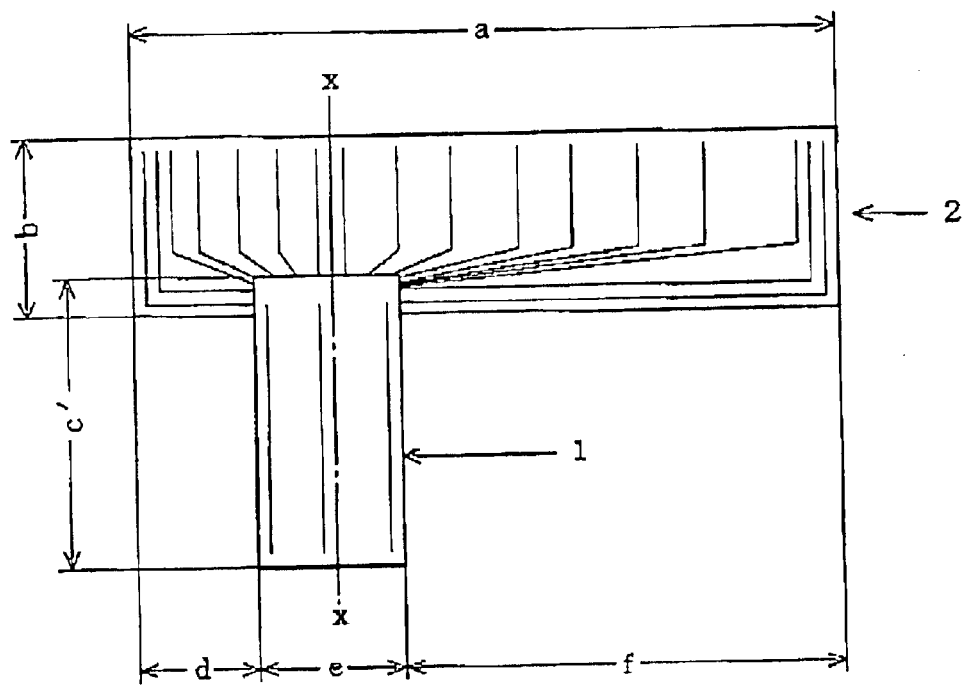
FIG. 1A is a plane view of one example of a flexible printed wiring board according to the present invention and FIG. 1B is a cross sectional view along x—x thereof.
Figure 1B:
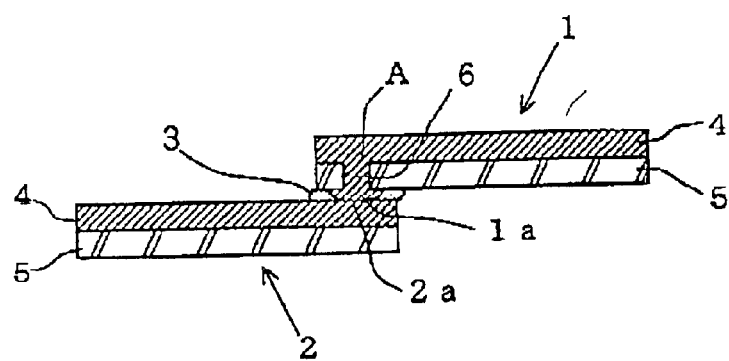

Flexible printed wiring board 10 in FIGS. 1A and 1B, the former being a plane view thereof and the latter being a cross section along x—x thereof, has a construction wherein first flexible printed wiring part 1 and second flexible printed wiring part 2 are stuck together by an adhesive layer 3 such that metal bump 1a of first flexible printed wiring part 1 and connection pad 2a of second flexible printed wiring part 2 are electrically connected. A reduction in the amount of laminated sheet discarded when the flexible printed wiring boards are created in the laminated sheet for flexible printed wiring can thus be achieved by adopting a construction wherein a flexible printed wiring board 10 is obtained by joining at least two parts (1, 2).

Figure 2:
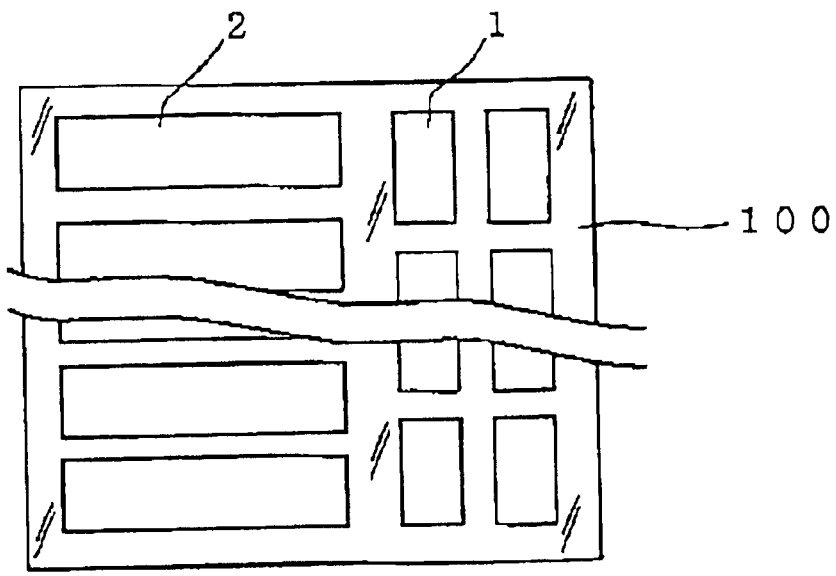
FIG. 2 is a plane view of a laminated sheet for flexible printed wiring in which first and second flexible printed wiring parts employed in the present invention are created.
Figure 6:
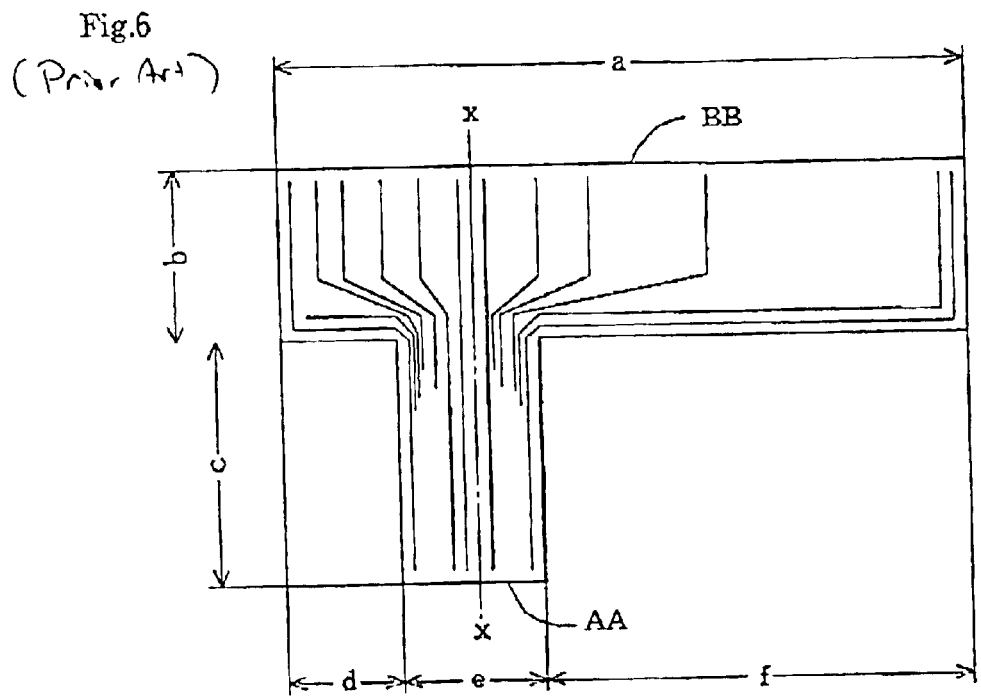
FIG. 6 is a plan view of a prior art flexible printed wiring board.
Figure 7:
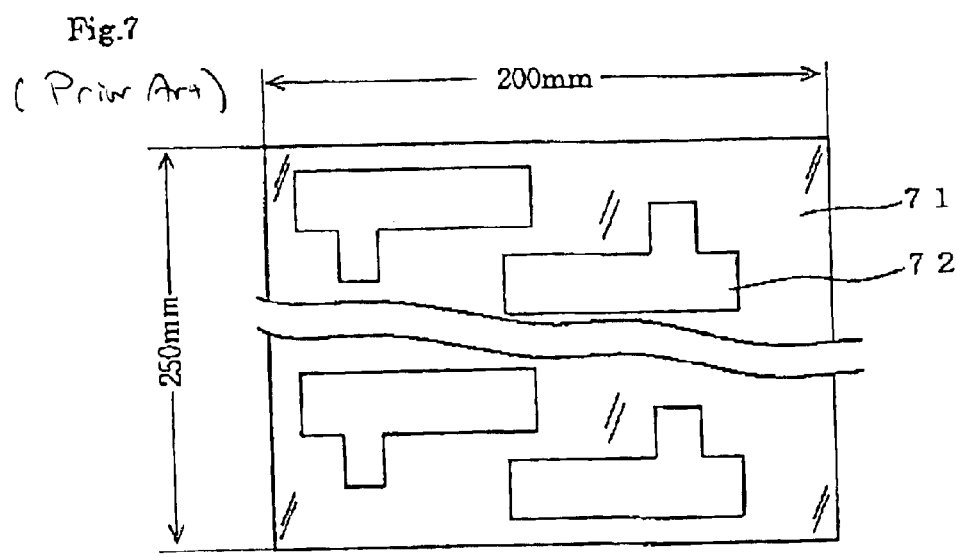
FIG. 7 is a plane view of a laminated sheet for flexible printed wiring in which conventional flexible printed wiring boards have been created.

For example, when the T-shaped flexible printed wiring board of FIG. 6 (size: a=160 mm/b=17 mm/c=30 mm/d=20 mm/e=25 mm/f=115 mm) is divided into a first flexible printed wiring part 1 (size: c'=35 mm/e=25 mm) and a second flexible printed wiring part 2 (size: a=160 mm/b=17 mm), these being created in a laminated sheet 100 for flexible printed wiring of size length 200 mm and width 250 mm as shown in FIG. 2, 10 sheets in each case can be respectively created; thus, compared with the case of FIG. 7 (58.4%), the discard ratio can be very considerably lowered, to 28.1%.

Also, metal bump 1a of the first flexible printed wiring part 1 in the present invention, as shown in FIG. 1B, is a portion where the tip of a metal plug 6 formed by an electrolytic plating method projects from insulating layer 5 into the interior of hole A formed by chemical etching using a photolithographic method, in the insulating layer 5 adjacent to conductive layer 4 of first flexible printed wiring part 1. In this way, metal bump 1a is capable of being formed conveniently and with low cost on the surface of first flexible printed wiring part 1.

The second flexible printed wiring part 2 is provided with an ordinary connection pad 2a in the portion adjacent to metal bump 1a of the first flexible printed wiring part 1, but otherwise comprises the same layer structure as a known flexible printed wiring board, such as for example conductive layer 4 and insulating layer 5 adjacent thereto.

Typically conductive layer 4 is made of copper foil, but it could be formed of another metal, gold, silver, aluminum, solder, nickel or the like or alloys of these.

The thickness of conductive layer 4 may be suitably determined in accordance with the object of use of the wiring board. Also, conductive layer 4 may be patterned in accordance with requirements.

According to the present invention, for insulating layer 5, the same construction may be adopted as for the insulating layer of a typical flexible printed wiring board; preferably, a polyimide layer, which is of excellent insulating properties, heat resistance, humidity resistance and voltage withstanding properties may desirably be employed. Use of a polyimide layer obtained by imidizing a polyamic acid is particularly preferable. This is because the holes can be precisely and conveniently formed prior to the imidizing step by chemical etching.

Also, the thickness of insulating layer 5 can be suitably determined in accordance with the object of use of the flexible printed wiring board.

As adhesive layer 3, an adhesive layer may be employed comprising adhesive used in manufacturing ordinary flexible printed wiring boards. For example, the generally known anisotropic conductive films, thermoplastic polyimides, epoxy resins or the like may be mentioned by way of example. Of these, an insulating thermoplastic polyimide layer, which has excellent affinity with insulating layer 5, insulating properties, heat resistance, resistance to humidity and voltage withstanding properties is preferably employed.

As metal plug 6 with which hole A is filled and as the metal bump 1a at the tip thereof projecting from insulating layer 5, as described above, a metallic substance formed by an electrolytic plating method, preferably an electrolytic copper plating plug (electrolytic copper plating bump) may be employed.

The diameter and height of metal plug 6 and the diameter and height of metal bump 1a can be suitably determined in accordance with the object of use of the flexible printed wiring board.

The surface or metal bump 1a of first flexible printed wiring part 1 may be suitably formed with a plated layer of noble metal such as gold in accordance with requirements in order to improve reliability of conduction.

Figure 3:
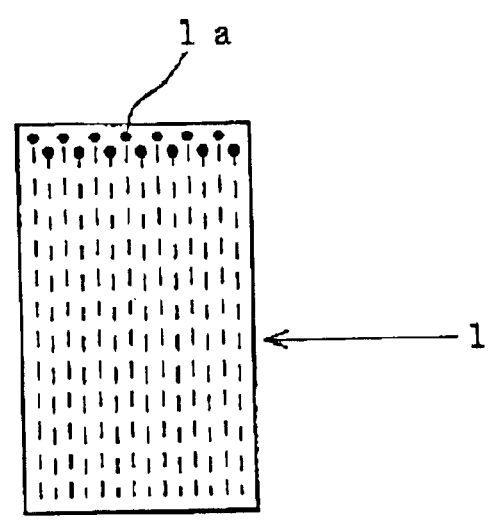
FIG. 3 is a surface view on the side of the metal bump face of a first flexible printed wiring part employed in the present invention.

Preferably the metal bumps 1a are arranged in a zigzag fashion as shown in FIG. 3. In this way, the wiring pitch can be reduced, and the flexible printed wiring board and the electronic equipment that employs this can be reduced in size and weight. In this case, preferably the connection pads of the second flexible printed wiring part are correspondingly arranged in zigzag fashion.

Next, each of the steps of a method of manufacturing a flexible printed wiring board according to the present invention will be described with reference to the drawings, taking as an example a case in which thermoplastic polyimide film is employed as adhesive layer 3.

Step (a)

Figure 4A:
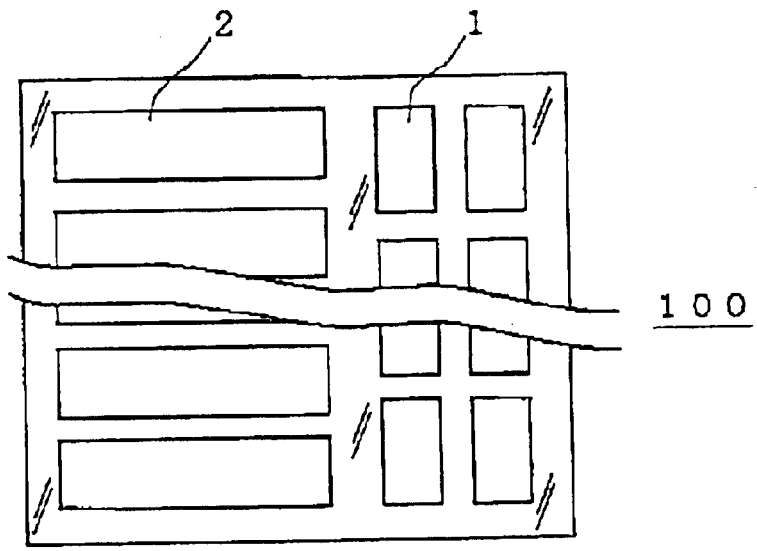
FIGS. 4A to 4D are diagrams of the steps of manufacturing a flexible printed wiring board according to the present invention.

First of all, first flexible printed wiring parts 1 and second flexible printed wiring parts 2 are created (FIG. 4A) in a laminated sheet 100 for flexible printed wiring formed of a conducting layer and an insulating layer adjacent thereto, in such a way that as many as possible or first flexible printed wiring parts 1 and second flexible printed wiring parts 2 can be obtained per unit area. First flexible printed wiring parts 1 and second flexible printed wiring parts 2 may be created in separate laminated sheets 100 for flexible printed wiring or both may be created in a single laminated sheet 100 for flexible printed wiring.

First flexible printed wiring parts 1 are manufactured as follows.

The second flexible printed wiring parts 2 may be created using known techniques.

Step (aa)

Figure 4B:
Figure 4C:
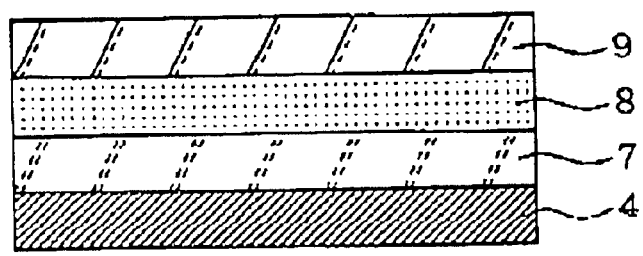
Figure 4D:
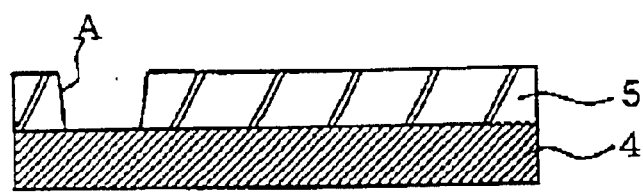

Holes A reaching conductive layer 4 are formed by chemical etching utilizing a photolithographic method in insulating layer 5 adjacent to conductive layer 4. More specifically, an insulating layer precursor layer 7 is formed by applying polyamic acid on to conductive layer 4 and drying (FIG. 4B). A photosensitive resist layer 8 is then formed by applying photosensitive resist thereon and drying and, in addition, a protective film 9 is laminated thereon (FIG. 4C). Patterning of photosensitive resist layer 8 is then performed by exposure through a photomask corresponding to the holes that are to be formed, and developing, and chemical etching is then carried out of the insulating layer precursor layer 7, using the patterned photosensitive resist layer 8 as an etching mask. After completion of etching, imidization is performed by the ordinary method, and an insulating layer 5 is formed (FIG. 4D) having holes A by removal of the photosensitive resist layer 8 and protective film 9.

The chemical etching conditions may be suitably determined in accordance with the material of the insulating layer precursor layer 7 and the size etc of holes A that are to be formed.

Step (ab)

Next, the metal plugs 6 are formed within holes A of insulating layer 5 by an electrolytic plating method of conductive layer 4 that are to constitute cathodes and these metal plugs 6 are continuously grown by further an electrolytic plating method, so that the tips thereof constitute metal bumps 1a (FIG. 5E) projecting from the surface of insulating layer 5. When this is done, preferably the outside surface 4a of conductive layer 4 is covered with masking tape (not shown).

The electrolytic plating conditions may be suitably determined in accordance with the type of plating metal and hole diameter, the plug size and the like that is to be formed.

Also, this masking tape may be removed prior to the subsequent plating step (ac) when forming adhesive layer 3, or, although not shown, may be maintained in this condition up to the final step.

Step (ac)

Next, adhesive layer 3 is formed (FIG. 5F) on the surface of insulating layer 5 formed with metal bumps 1a, so as to submerge metal bumps 1a if required.

Formation or adhesive layer 3 may be achieved for example by applying a thermoplastic polyimide solution using a knife coater, then drying.

Step (ad)

Next, chemical etching-back or the surface of adhesive layer 3 is performed so that metal bumps 1a have a prescribed height. In this way, the first flexible printed wiring parts provided with adhesive layer 3 on their surface are obtained (FIG. 5G).

The conditions of chemical etching back of adhesive layer 3 may be suitably determined in accordance with the material of adhesive layer 3, the material of metal bumps 1a, and the required amount of etch-back etc. For example, if adhesive layer 3 is a thermoplastic polyimide layer, an aqueous solution of alkali can be employed as etchant.

Step (b)

Next, the individual parts are divided out (FIG. 5H) from the laminated sheet for flexible printed wiring by cutting out first flexible printed wiring parts 1 and second flexible printed wiring parts 2.

Step (c)

The first flexible printed wiring part 1 and second flexible printed wiring part 2 thus obtained are stuck together by adhesive layer 3 while establishing connection of metal bumps 1a and connection pads 2a. In this way, the flexible printed wiring board of FIG. 5I is obtained without using anisotropic conductive adhesive film or conductive paste.

Figure 5E:
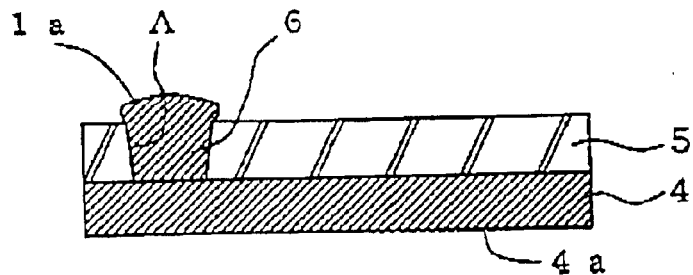
FIGS. 5E to 5I are diagrams of the steps of manufacturing a flexible printed wiring board according to the present invention.
Figure 5F:
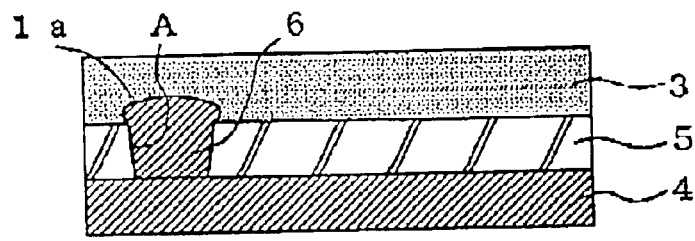
Figure 5G:
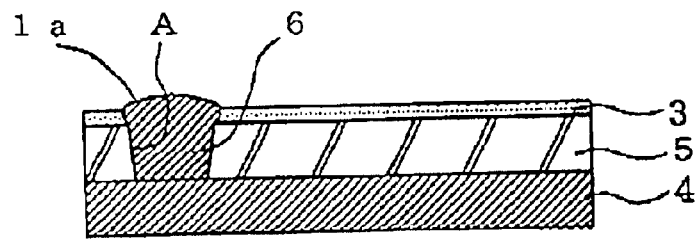
Figure 5H:
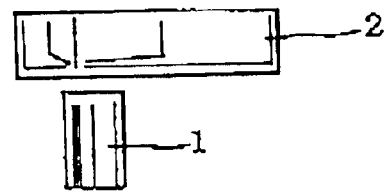
Figure 5I:
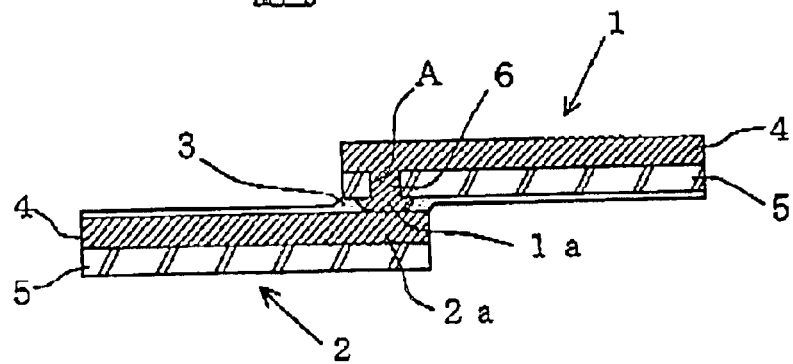

A flexible printed wiring board in accordance with FIGS. 1A and 1B is obtained by sticking together first flexible printed wiring part 1 and second flexible printed wiring part 2 in the condition of FIG. 5E using separately provided anisotropic conductive adhesive film or conductive paste.

The flexible printed wiring board which is thus obtained may be advantageously applied to various types of electronic equipment.

EXAMPLES

The present invention is described in detail below with reference to Practical Examples.

Example 1

A solution of polyamic acid obtained by dissolving 1.01 mol of pyromellitic acid dianhydride and 1.0 mol of 4, 4'-diaminodiphenyl ether in N-methyl-2-pyrrolidone as solvent was applied to one face of copper foil of thickness 18 $\mu$m to give a dry thickness of 10 $\mu$m, then dried.

A photosensitive resist (NR-41 (nylon-oligoester based resist), manufactured by Sony Chemical Corporation) was applied on to this polyamic acid layer so as to provide a dry thickness of 8 $\mu$m, then dried, and, in addition, a further protective film of thickness of 12 $\mu$m (polyester film, manufactured by Toray Corporation) was laminated thereon.

The photosensitive resist was patterned into first flexible printed wiring parts and second flexible printed wiring parts, then in each case, per unit area (200×250 mm), by exposing the photosensitive resist by illuminating with light of wavelength 365 nm from the side of the protective film, using a negative film as photomask, and developing.

Using the patterned photosensitive resist as etching mask, holes were formed in the polyamic acid layer constituting the first flexible printed wiring part by chemical etching of the polyamic acid layer (etching temperature 25° C., etching time 15 seconds) with an alkaline solution. The copper foil was exposed at the bottom of the holes, the diameter of the bottom being 50 $\mu$m, and the diameter of the holes at the surface of the polyamic acid layer being 80 $\mu$m.

Next, an insulating layer was produced by imidizing the polyamic acid layer in which the holes were formed (imidization heating temperature 350° C., imidization heating time 10 minutes).

Next, after covering the outer surface of the copper foil with masking tape, electrolytic copper plating was performed using the copper foil as cathode (copper sulfate plating bath, plating bath temperature 30° C., plating current density 15 A/dm$^2$, plating time 30 minutes). As a result, copper bumps were formed projecting to a height of 20 $\mu$m from the surface of the insulating layer of the first flexible printed wiring parts.

Next, a polyamic acid solution obtained by dissolving 1.01 mol of 3, 4, 3', 4'-biphenyl-tetracarboxylic acid dianhydride and 1.0 mol of 1, 3-bis(3-aminophenoxy)benzene in N-methyl-2-pyrrolidone solvent was applied using a knife coater so as to form a thermoplastic polyimide layer (adhesive layer) of dry thickness 20 $\mu$m over the entire surface of the insulating layer on the copper bump side; drying was then performed.

Next, chemical etch back (etch back temperature 25° C., etch-back time 15 seconds) was performed using an aqueous solution of alkali on the surface of the adhesive layer such that the exposed heights of the copper bumps became 10 $\mu$m; a thermoplastic polyimide layer was then completed by imidizing the polyamic acid; first flexible printed wiring parts and second flexible printed wiring parts as shown in FIG. 2, were thereby manufactured.

The first flexible printed wiring parts and second flexible printed wiring parts which were thus obtained were respectively released. When the metal bumps of the first flexible printed wiring parts were superimposed on the connection pads of the second flexible printed wiring parts and joined by hot pressure fixing (joining temperature 260° C., joining time 10 seconds), it was found possible to achieve joints of high adhesive strength and reliable conduction.

INDUSTRIAL APPLICABILITY

A flexible printed wiring board according to the present invention can be manufactured by utilizing a laminated sheet for flexible printed wiring of a prescribed size without waste, so it can be manufacture with low cost and furthermore has excellent conduction reliability.

What is claimed is:

1. A flexible printed wiring board comprising a first flexible printed wiring part having metal bumps and a second flexible printed wiring part having connection pads, the metal bumps and the connection pads being connected to each other, wherein the flexible printed wiring part comprises a conductive layer and an insulating layer adjacent thereto, holes are provided in the insulating layer so as to reach the conductive layer; metal plugs are formed in said holes by an electrolytic plating method; and the tips of the metal plugs constitute the metal bumps that project from insulating layer, wherein the insulating layer is a polyimide layer and the metal plugs are electrolytic copper plating plugs.

2. The flexible printed wiring board according to claim 1, wherein the insulating layer is obtained by imidizing polyamic acid.

3. The flexible printed wiring board according to claim 1, wherein the first flexible printed wiring part and the second flexible printed wiring part are stuck together by an anisotropic conductive film, thermoplastic polyimide, or epoxy resin.

4. A method of manufacturing a flexible printed wiring board according to claim 1, comprising:

(a) a step of creating first flexible printed wiring parts and/or second flexible printed wiring parts in a laminated sheet for flexible printed wiring composed of a conductive layer and an insulating layer formed adjacent thereto, such that as many as possible first flexible printed wiring parts and/or second flexible printed wiring parts can be obtained per unit area of the laminated sheet;

in which the metal bumps of the first flexible printed wiring parts are created by forming holes in the insulating layer adjacent to the conductive layer, so as to reach the conductive layer, by chemical etching using a photolithographic method, then, while forming metal plugs in the holes of the insulating layer by an electrolytic plating method in which the conductive layer is used as the cathode, further continuously growing these metal plugs by an electrolytic plating method so that the tips thereof project from the surface of the insulating layer;

(b) a step of obtaining the first flexible printed wiring parts and the second flexible printed wiring parts from the laminated sheet for flexible printed wiring by cutting the same; and (c) a step of sticking together the first flexible printed wiring parts and the second flexible printed wiring parts that have thus been obtained while ensuring conduction between the metal bumps of the first flexible printed wiring parts and the connection pads of the second flexible printed wiring parts.

5. The flexible printed wiring board according to claim 1, wherein the metal bumps of the first flexible printed wiring parts and the connection pads of the second flexible printed wiring part are arranged in a zigzag fashion.

6. The flexible printed wiring board according to claim 1, wherein the first flexible printed wiring part and the second flexible printed wiring part are stuck together by an anisotropic conductive film, thermoplastic polyimide, or epoxy resin.

7. The flexible printed wiring board according to claim 2, wherein the metal bumps of the first flexible printed wiring part and the connection pads of the second flexible printed wiring part are arranged in a zigzag fashion.

8. The flexible printed wiring board according to claim 2, wherein the first flexible printed wiring part and the second flexible printed wiring part are stuck together by an anisotropic conductive film, thermoplastic polyimide, or epoxy resin.

9. A flexible printed wiring board comprising a first flexible printed wiring part having metal bumps and a second flexible printed wiring part having connection pads, the metal bumps and the connection pads being connected to each other, wherein the first flexible printed wiring part comprises a conductive layer and an insulating layer adjacent thereto; holes are provided in the insulating layer so as to reach the conductive layer; metal plugs are formed in said holes by an electrolytic plating method; and the tips of the metal plugs constitute the metal bumps that project from the insulating layer, wherein the metal bumps of the first flexible printed wiring parts and the connection pads of the second flexible printed wiring part are arranged in a zigzag fashion.

10. The flexible printed wiring board according to claim 9, wherein the first flexible printed wiring part and the second flexible printed wiring part are stuck together by an anisotropic conductive film, thermoplastic polyimide, or epoxy resin.

* * * * *